United States Patent [19]

Seipler

[11] Patent Number: 5,266,745
[45] Date of Patent: Nov. 30, 1993

[54] THICK FILM HYBRID ARRANGEMENT WITH OUTER CONTACTS

[75] Inventor: Dieter Seipler, Reutlingen, Fed. Rep. of Germany

[73] Assignee: Robert Bosch GmbH, Stuttgart, Fed. Rep. of Germany

[21] Appl. No.: 760,692

[22] Filed: Sep. 16, 1991

[30] Foreign Application Priority Data

Oct. 4, 1990 [DE] Fed. Rep. of Germany ....... 4031203

[51] Int. Cl.⁵ .............................................. H05K 1/00
[52] U.S. Cl. .................................................... 174/250
[58] Field of Search .................. 174/72 B, 103, 250, 174/251, 253, 254; 439/61, 60, 59; 361/397, 401, 403

[56] References Cited

U.S. PATENT DOCUMENTS

| 3,585,455 | 6/1971 | Naylor | 361/398 X |
| 4,401,844 | 8/1983 | Fleuret | 174/72 B |
| 4,827,328 | 5/1989 | Ozawa et al. | 361/402 X |
| 4,835,394 | 5/1989 | Steele | 174/103 X |
| 5,051,542 | 9/1991 | Hernandez | 361/398 X |

Primary Examiner—Leo P. Picard
Assistant Examiner—Trinidad Korka
Attorney, Agent, or Firm—Michael J. Striker

[57] ABSTRACT

A thick film hybrid arrangement has a plurality of ceramic foils provided with conductor paths and superimposed over one another, a support for supporting the ceramic foils, and a plurality of thin metal lugs located between the ceramic foils for contacting the conducting paths. The metal lugs extend outwardly beyond at least the ceramics foils so as to form outer contacts.

8 Claims, 1 Drawing Sheet

THICK FILM HYBRID ARRANGEMENT WITH OUTER CONTACTS

BACKGROUND OF THE INVENTION

The present invention relates to a thick film hybrid arrangement with outer contacts.

More particularly, it relates to a thick film hybrid arrangement which has several circuit contacts superposed over one another in a film technique and arranged on a support of metal or ceramic.

Thick film hybrid arrangements of the above mentioned general type are known in the art. The known thick film hybrid arrangements are arranged inside a metal housing and have outwardly projecting metal pins which form outer contacts. The metal pins are extended through metal caps in an insulated manner. Glass is utilized as an insulating material. This known type of mounting of the outer contacts requires substantial labor expenses, especially in the case of multi-layer circuits. During the throughcontacting it must be moreover guaranteed that between the circuit planes located over one another no undesired short-circuiting occurs.

SUMMARY OF THE INVENTION

Accordingly, it is an object of the present invention to provide a thick film hybrid arrangement of the above mentioned general type, which avoids the disadvantages of the prior art.

In keeping with these objects and with others which will become apparent hereinafter, one feature of the present invention resides, briefly stated, in a thick film hybrid arrangement in which between the ceramic foils for contacting with conductor path located there, thin metal lugs are inserted which laterally project from the thick film hybrid arrangement as outer contacts.

When the thick film hybrid arrangement is designed in accordance with the present invention it avoids the disadvantages of the prior art.

In the thick film hybrid arrangement during the manufacture of the arrangement several layers with laterally inserted outer contacts can be arranged over one another, then during the required sintering process the inserted outer contacts are connected with the conductor path. The contacting between the outer contact conductor pathes does not therefore need additional working steps, whereby a rational manufacture is possible.

It is also advantageous when the outer contact is placed in an insulating body which directly adjoins the circuit layers. In this case the insulating body insures both a reliable insulation between the outer contacts and also a sufficient mechanical stability for stabilization of the outer contacts. The insulation body forms a lateral block strip which facilitates the handling of the thick film hybrid arrangement. The insulating body can be injection molded in a simple manner as a synthetic plastic strip, laterally on the thick film hybrid arrangement, and thereby connected with the thick film hybrid arrangement.

The outer contacts in the region between the circuit planes are very thin, and their material thickness amounts to approximately 0.1 mm. For increasing the mechanical stability, the material thickness of the outer contacts can increase outwardly and reach there more than 0.5 mm. The thus formed outer contacts can be produced as punch-out metal sheet shaped parts. By additional pressing or rolling process, the one-side material reduction can be provided.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENT

Figure 1:
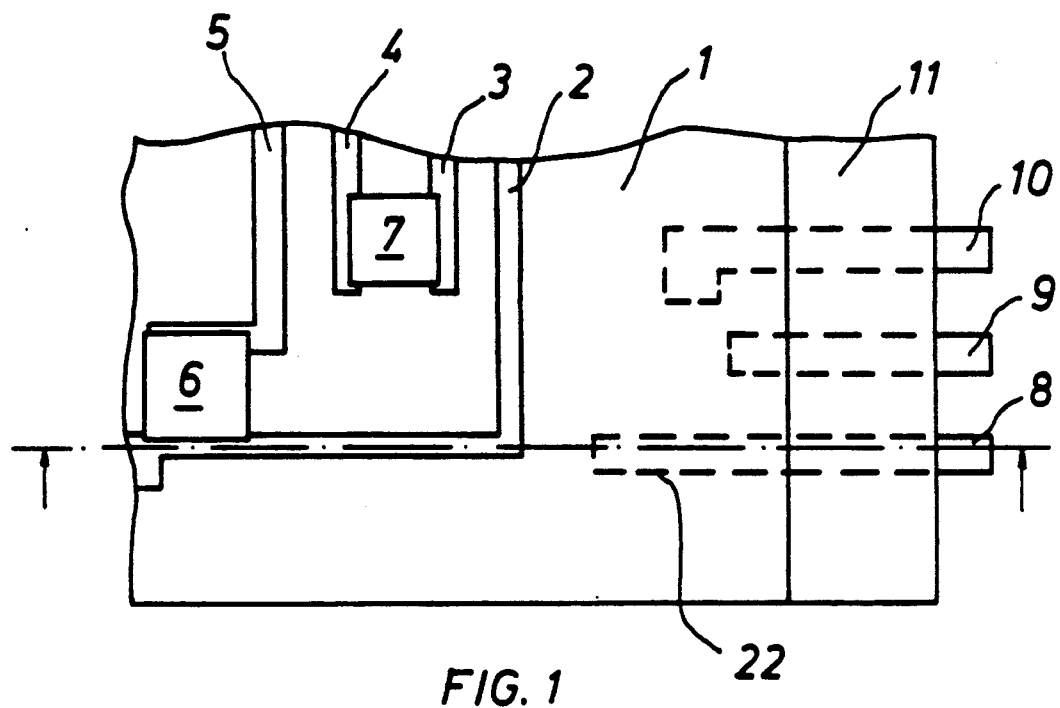
FIG. 1 is a plan view of the thick film hybrid arrangement in accordance with the present invention.

A thick film hybrid arrangement shown in FIG. 1 has in its upper visible surface an upper wiring plane 1 with several conductor paths 2, 3, 4 and 5 which are electrically connected with structural elements 6 and 7. Outer contacts 8, 9 and 10 extend outwardly beyond a right side of the thick layer hybrid arrangement on an injection molded insulation body 11. The insulation body 11 is composed of electrically insulating material and together with the outer contacts 8, 9, 10 and 12, shown in FIG. 2, forms a plug strip.

Figure 2:
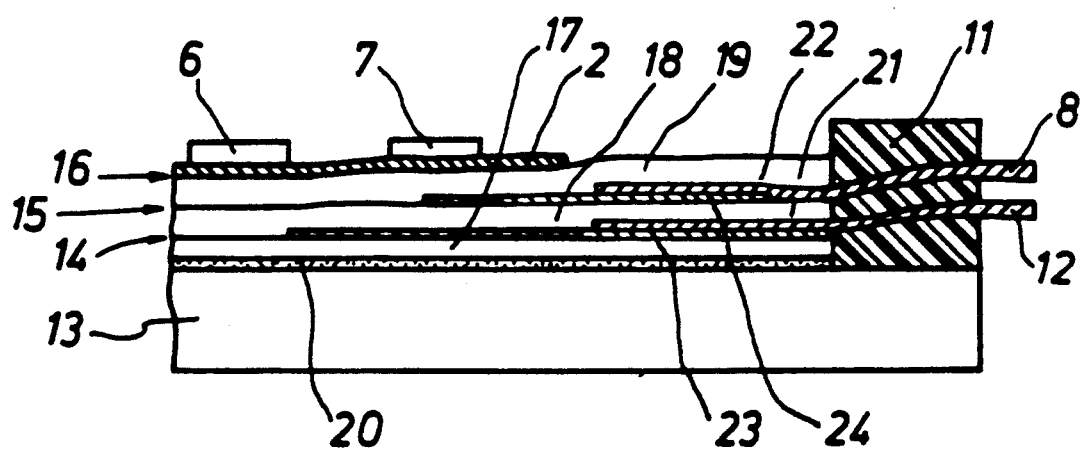
FIG. 2 is a view showing a section of the inventive hybrid arrangement of FIG. 1, taken along the line 2—2.

FIG. 2 shows a longitudinal section along the line 2—2. It can be seen there especially clearly that the thick layer hybrid arrangement has a support 13 composed of metal, and several conductor paths planes 14, 15 and 16 located on the support 13 and superposed over one another. Each of these planes is formed by conductor path placed on a ceramic foil 17, 18 and 19. The lower ceramic foil 17 is connected with the support 13 by an adhesive layer 20.

During the manufacture of the thick film hybrid arrangement in accordance with the present invention, the individual foils are successively placed over one another with the conductor path placed on them. For mounting of outer contacts 8, 9, 10, 12, wherein 9 and 10 are not shown, metal lugs 21 and 22 formed as metal sheet shaped parts are placed between the foils. In a subsequent sintering process the thick film hybrid arrangement is produced with the individual layers firmly connected with one another. The conductor paths 23 and 24 of the placed metal lugs 21 and 22 are electrically connected with the above mentioned conductor paths in an electrically conductive manner. Subsequently the lateral insulating body 11 is injection molded in a known synthetic plastic injection molding process, so that the extending outer contacts 8, 9, 10 and 12 are insulated from one another and mechanically fixed.

It is to be understood that the support 13 must not be entirely composed of metal. It can also be made of ceramic.

It will be understood that each of the elements described above, or two or more together, may also find a useful application in other types of constructions differing from the types described above.

While the invention has been illustrated and described as embodied in a thick film hybrid arrangement, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A thick film hybrid arrangement comprising a plurality of ceramic foils provided with conductor paths and superimposed over one another; a support for supporting said ceramic foils; a plurality of thin metal lugs located between said ceramic foils for contacting said conducting paths, said metal lugs extending outwardly beyond at least said ceramic foils so as to form outer contacts; and an insulating body which directly adjoins said ceramic foils, said outer contacts being supported in said insulating body.

2. An arrangement as defined in claim 1, wherein said support is composed of metal.

3. An arrangement as defined in claim 1, wherein said support is composed of ceramic.

4. An arrangement as defined in claim 1, wherein said insulating body is formed as an injection molded synthetic plastic member.

5. A thick film hybrid arrangement, comprising a plurality of ceramic foils provided with conductor paths and superimposed over one another; a support for supporting said ceramic foils; and a plurality of thin metal lugs located between said ceramic foils for contacting said conducting paths, said metal lugs extending outwardly beyond at least said ceramic foils so as to form outer contacts, said metal lugs being formed as metal sheet shaped parts.

6. An arrangement as defined in claim 5, wherein said metal lugs have a thickness which increases outwardly.

7. A thick film hybrid arrangement, comprising a plurality of ceramic foils provided with conductor paths and superimposed over one another; a support for supporting said ceramic foils; and a plurality of thin metal lugs located between said ceramic foils for contacting said conducting paths, said metal lugs extending outwardly beyond at least said ceramic foils so as to form outer contacts, said metal lugs having a thickness of substantially 0.1 mm.

8. An arrangement as defined in claim 7, wherein said metal lugs have a thickness which increases outwardly from 0.1 mm to more than 0.2 mm.

* * * * *